United States Patent [19]
Schmidt-Kreusel et al.

[11] Patent Number: 5,787,004
[45] Date of Patent: Jul. 28, 1998

[54] METHOD FOR COMPUTER-ASSISTED ITERATIVE DETERMINATION OF THE TRANSIENT RESPONSE OF A QUARTZ RESONATOR CIRCUIT

[75] Inventors: Christof Schmidt-Kreusel, Duisburg; Qinghua Zheng, Iaufkirchen; Joerg-Uwe Feldmann, Munich, all of Germany

[73] Assignee: Siemens Aktiengesellschaft, Munich, Germany

[21] Appl. No.: 787,441

[22] Filed: Jan. 22, 1997

[30] Foreign Application Priority Data

Jan. 22, 1996 [DE] Germany ............ 196 02 125.1

[51] Int. Cl.$^6$ ............... H03H 9/02; G06F 17/50
[52] U.S. Cl. ............... 364/484; 364/488; 364/489; 395/750.03; 331/159; 331/163
[58] Field of Search ............... 364/570, 578, 364/488, 489, 484, 481; 395/750.03, 750.04; 324/76.11, 76.39, 76.77, 76.91, 727; 310/361, 348, 368, 370, 315, 312, 344, 369, 367, 320, 346, 351, 365, 366; 331/158, 159, 116 R, 163, 116 FE, 66, 109, 183

[56] References Cited

U.S. PATENT DOCUMENTS

| | | | |
|---|---|---|---|
| 4,191,906 | 3/1980 | Kogure | 310/370 |
| 4,437,773 | 3/1984 | Dinger et al. | 310/361 |
| 4,633,124 | 12/1986 | Kawashima | 310/361 |
| 4,985,687 | 1/1991 | Long | 310/315 |
| 5,311,096 | 5/1994 | Kawashima | 310/361 |
| 5,334,900 | 8/1994 | Kawashima | 310/370 |
| 5,444,641 | 8/1995 | White | 364/484 |
| 5,530,391 | 6/1996 | Bohme et al. | 327/311 |
| 5,630,949 | 5/1997 | Lakin | 216/61 |

OTHER PUBLICATIONS

Nguyen, et al. "Si IC-Compatible Inductors and LC Passive Filters", IEEE Journal of Solid-State circuits, vol. 25, No. 4, pp. 1028-1031, Aug. 1990.

Brennan, et al. "The CMOS Negative Impedance Converter", IEEE Journal of Solid-State Circuits, vol. 23, No. 5, pp. 1272-1275, Oct. 1988.

Unkrich, et al. "Conditions for Start-up in Crystal Oscillators", IEEE Journal of Solid-State Circuits, vol. SC-17, No. 1, pp. 87-90, Feb. 1982.

Aeü, vol. 46, No. 4,(1992) Hirzel-Verlag Stuttgart, U. Feldmann et al, Algorithms for Modern Circuit Simulation, pp. 274-285.

IEEE Transactions on Circuits and Systems-1: Fundamental Theory and Applications, vol. 40, No. 8, Aug. 1993, I. Ivanisevic, The Quartz Crystal Oscillator Realization Using Current Conveyors, pp. 530-533.

IEEE Transactions on Ultrasonics, Ferroelectrics and Frequency Control, vol. 41, No. 2, Mar. 1994, L. Dworsky et al, a Simple Single Model for Quartz Crystal Resonator Low Level Drive Sensitivity and Monolithic Filter Intermodulation, pp. 261-268.

IEEE Transactions on Circuits and Systems, vol. 34, No. 3, Mar. 1987, Andreas Rusznyak, Start-Up Time of CMOS Oscillators, pp. 259-267.

(List continued on next page.)

*Primary Examiner*—Emanuel Todd Voeltz
*Assistant Examiner*—Cuong H. Nguyen
*Attorney, Agent, or Firm*—Hill & Simpson

[57] ABSTRACT

In the method, following an operating point determination of the quartz resonator circuit, a substitution of the equivalent circuit diagram of the quartz resonator by an independent current source is implemented with the initial, previously determined amplitude of the current of the dynamic arm of the quartz resonator. The dynamic equilibrium state is determined for this circuit arrangement with firing methods or methods of harmonic balance. After a resubstitution of the current source by the equivalent circuit diagram of the quartz resonator, a transient analysis is implemented for the dynamic equilibrium state. This method is iteratively implemented as long as the identified growth rate lies above a prescribable barrier.

14 Claims, 3 Drawing Sheets

OTHER PUBLICATIONS

IEEE Journal of Solid–State Circuits, vol. 27, No. 5, May 1992, N. Nguyen et al, Start–Up and Frequency Stability in High–Frequency Oscillators, pp. 810–820.

Analog Methods for Computer–Aided Circuit Analysis and Diagnosis, T. Ozawa (Ed.), Marcel Dekker, Inc., ISBN 0–8247–7843–0, (1988), K. Kundert et al, Techniques for Finding the Periodic Steady–State Response of Circuits, pp. 169–203.

METHOD FOR COMPUTER-ASSISTED ITERATIVE DETERMINATION OF THE TRANSIENT RESPONSE OF A QUARTZ RESONATOR CIRCUIT

BACKGROUND OF THE INVENTION

The present invention is directed to a method that makes a class of circuits accessible to handling within the framework of computer-supported circuit design. These are high quality quartz oscillators for generating high-precision frequency normals. The significance of this type of circuit becomes evident when one considers that imprecisions in the running of pendulum clocks produced by the gravitational influence of the moon and irregularities in the rotational period of the earth that are just as weak were capable of being documented for the first time by using these circuits.

Even though more than seven quartz resonators are employed on average per household just in the Federal Republic of Germany and this component is thus in very wide use, there is no tool to date with whose assistance professional developers in industry and technology can test and optimize the circuits they need on line at the computer.

Contrary to the belief that it is not all too difficult to construct a functioning quartz oscillator, the design of high quality oscillators is known only vaguely and fragmentarily to persons involved in general with electronics.

The determination of the transiency with a known method, what is referred to as transient analysis of weakly stable systems (U. Feldmann et al., Algorithms for Modern Circuit Simulation AEÜ, Vol. 46, No. 2, Hirzel-Verlag Stuttgart, pp. 274–285, 1992), particularly harbors the disadvantage given transient analysis to quartz resonator circuits that, in purely quantitative terms, they make too high a demand of each calculating unit.

This becomes clear since extreme transient times (after triggering the system by starting up the operating voltage) are observed in the simulation of quartz oscillators, and the necessity is thus established of having to calculate an extremely great number of periods within a traditional transient analysis (U. Feldmann et al., Algorithms for Modern Circuit Simulation AEÜ, Vol. 46, No. 2, Hirzel-Verlag Stuttgart, pp. 274–285, 1992), until a steady state is present.

The duration of the transiency is dependent on the selected operating point and on the quality of the resonator.

As a valid rule of thumb, the transient period $t_r$ can be estimated as $t_r=10^4$ through $10^7 \times T$, where T references a period of the oscillation of the resonator voltage.

Based on a "sampling rate" of 50 for the fundamental mode, this would yield a minimum of 500,000 integration steps for this example. This means that even the smallest circuits with average quality and given a demand for meaningful precision require calculating times of 6 to 8 hours on a modern work station. This requirement increases for larger circuits and increasing quality of the resonator. Overall, calculating times of several weeks can result, accompanied by an enormous requirement for memory capacity for the data arising during the determination of the transiency of the quartz resonator circuit.

The method known from (I. Ivanisevic, The Quarts Crystal Oscillator Realization Using Current Conveyors, IEEE Transactions on Circuits and Systems-I: Fundamental Theory and Applications, Vol. 40, No. 8, pp. 530–533, August 1993), makes initial attempts to solve this problem of the immense calculating time demands. In this method, the resonator inductance $L_m$ is lowered and the resonator capacitance $C_m$ is raised within the equivalent circuit diagram of the quartz resonator that contains a resonator inductance $L_m$ as well as a resonator capacitance $C_m$. Further, the resonator resistance $R_m$ is left unmodified. The resonatability of the system can in fact be tested therewith. However, the transient period and important quantities such as the occurring frequency of the resonator circuit cannot be derived therefrom. This represents a considerable disadvantage of this known method since transient periods that are still enormous remain.

SUMMARY OF THE INVENTION

It is an object of the present invention to provide a method for computer-supported iterative determination of the transiency of a quartz resonator circuit that substantially reduces the required calculating capacity for implementation of the method on a computer.

In general terms the present invention is a method for computer-supported iterative determination of the transience of a quartz resonator circuit by a computer. The operating point of the quartz resonator circuit is determined. An equivalent circuit diagram of the quartz resonator is replaced by a current source with the initial amplitude of the current of the dynamic arm of the quartz resonator. The dynamic equilibrium state is determined for the quartz resonator circuit with the substituted current source. The current source is replaced by the equivalent circuit diagram of the quartz resonator. A growth rate of the amplitude of the current of the dynamic arm of the quartz resonator is determined for the dynamic equilibrium state of the quartz resonator circuit with a transient analysis. The above-described steps are respectively implemented for an amplitude-boosted current of the dynamic arm of the quartz resonator when the growth rate is greater than zero, and for an amplitude-reduced current of the dynamic arm of the quartz resonator when the growth rate is less than zero, until the respectively current growth rate is less than a predetermined threshold. The transience of the quartz resonator circuit is determined from the iteratively determined sequence of growth rates.

In the method, the operating point of the entire circuit is determined after determining an initial amplitude of the current of the dynamic arm of the quartz resonator. The equivalent circuit diagram of the series arm of the quartz resonator is now substituted by a current source that delivers a current having the size of the initial amplitude that was determined in the preceding step.

A dynamic equilibrium state is now determined for the quartz resonator circuit with the substituted current source, for example, with a firing method or with a method of harmonic balance.

After the dynamic equilibrium state has been determined, the equivalent circuit diagram of the quartz resonator is now re-substituted and thus replaces the current source.

A growth rate of the amplitude of the current of the dynamic arm of the quartz resonator is now determined with a transient analysis for the previously determined dynamic equilibrium state. These steps are iteratively repeated until the growth rate for the respective iteration step is lower than a predetermined threshold. These method steps are implemented anew for each iteration step, dependent on the size of the growth rate of the amplitude of the current of the dynamic arm of the quartz resonator. This ensues with a current of the dynamic arm of the quartz resonator that has been increased in amplitude for that case wherein the growth rate in the preceding iteration step is greater than zero as well as with a current that has been decreased in amplitude in case the growth rate is smaller than zero.

All identified growth rates that exhibit a value that is greater than zero are stored, and the transiency of the quartz resonator circuit is finally determined from this sequence of growth rates.

A possibility of implementing the transiency in acceptable dimensions with respect to the demands on calculating demand is thus presented for the first time. An advantage of the inventive method is that the run-up of the substituted source can ensue in large steps compared to the period duration of the oscillatory oscillation. This means that a spacing of (under certain circumstance) several tens of thousands of periods corresponds to the individual, clearly separated amplitude values of the source on the time axis.

The transient characteristic is thus only calculated only by points and, provided with a suitable phase condition, following the envelope.

The global behavior is reconstructed from these temporally locally extracted quantities and the transient characteristic is thus identified.

Thus, it is especially advantageous to employ the so-called firing method for determining the dynamic equilibrium state.

Alternatively thereto, however, it is also advantageous to utilized what is referred to as the method of harmonic balance for determining the dynamic equilibrium state.

It is likewise advantageous to employ the negative resistance model for modeling the circuit to be calculated.

In a development of the method, it is advantageous to undertake the determination of the transiency such that a sequence of time steps from the sequence of stored growth rates is determined. The transient period of the quartz resonator circuit derives from the sum of the sequence of time steps from this sequence of time steps.

BRIEF DESCRIPTION OF THE DRAWINGS

The features of the present invention which are believed to be novel, are set forth with particularity in the appended claims. The invention, together with further objects and advantages, may best be understood by reference to the following description taken in conjunction with the accompanying drawings, in the several Figures of which like reference numerals identify like elements, and in which:

DESCRIPTION OF THE PREFERRED EMBODIMENTS

Figure 1:
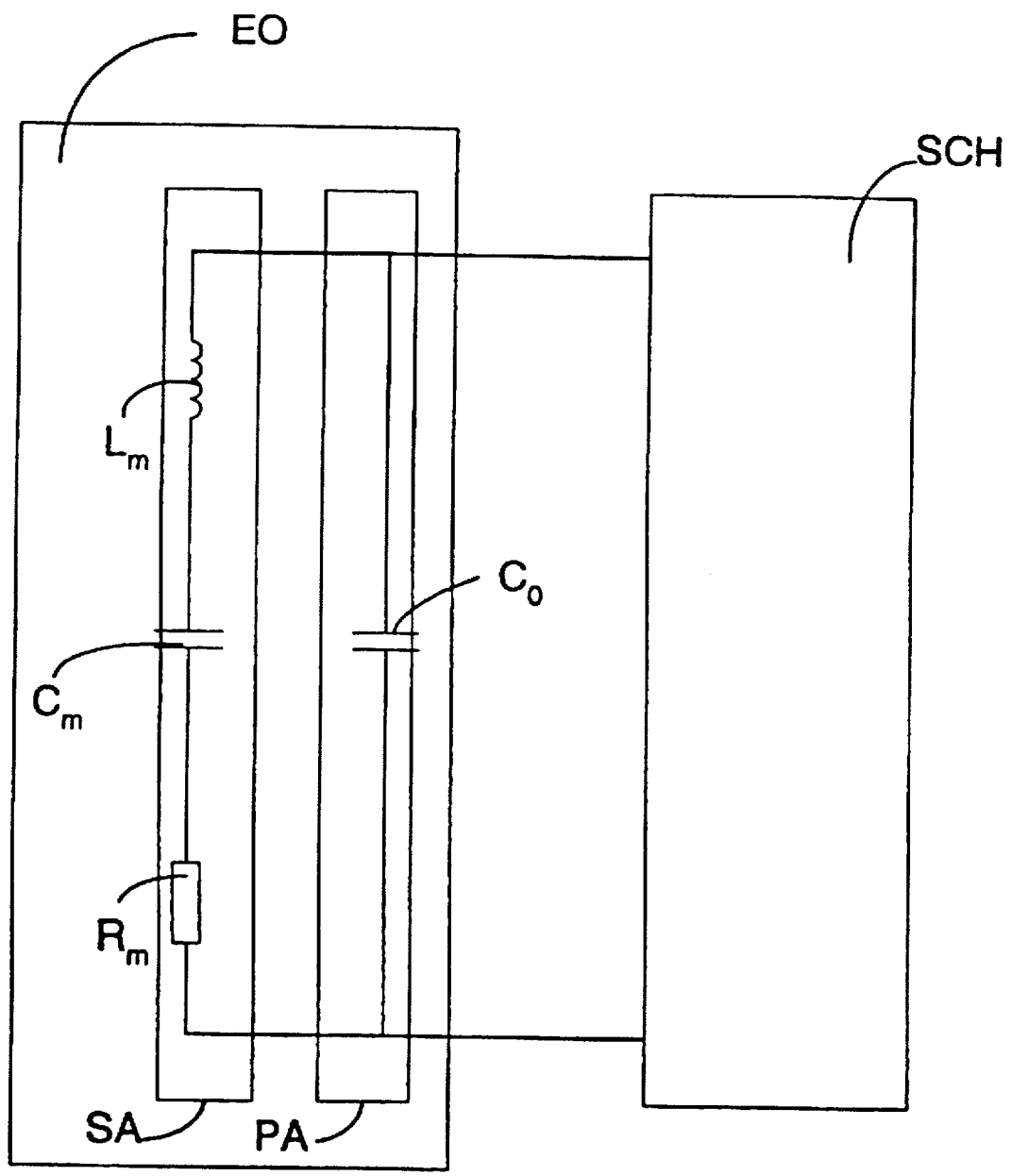
FIG. 1 depicts a circuit wherein the quartz resonator is shown in the form of an equivalent circuit diagram that is coupled to the rest of the circuit to which the quartz resonator is coupled.

FIG. 1 shows an equivalent circuit diagram EO of a quartz resonator to be modeled.

The equivalent circuit diagram comprises the following components: a series arm SA with a resonator inductivity $L_m$, a resonator capacitance $C_m$, as well as a resonator resistance $R_m$, and a parallel arm PA with a parallel capacitance $C_0$.

The equivalent circuit diagram EO and, thus, the quartz resonator is coupled to an arbitrary circuit SCH. It proves advantageous for the inventive method to allocate the parallel capacitance $C_0$ to the circuit SCH in the determination of the circuit quantities. Only the series arm SA of the equivalent circuit diagram EO is thus substituted with an independent current source (to be described later) in continuation of the method.

It is assumed for the circuit SCH, which can comprise an arbitrary circuit arrangement, that the circuit SCH is active, i.e. "delivers" energy to the series arm SA. This assumption is necessary for an oscillation of the quartz oscillator since the equivalent circuit diagram EO comprises the passive resonator resistance $R_m$.

The series arm SA thus requires energy so that the condition for the oscillation of the quartz oscillator is satisfied. The circuit SCH supplies this energy. The necessity of an active circuit SCH is taken into consideration in what is referred to as a negative resistance model. The circuit SCH plus the parallel arm PA, i.e. the parallel capacitance $C_0$, is thereby modeled as a series circuit of a load capacitor C and a load resistor R. The energy required for the oscillation in the framework of this model is supplied by the load resistor R (see FIG. 2).

The inventive method can be advantageously utilized for design verification in the design of quartz resonator circuits. The method presented here is based on some assumptions, the quality of the method being very good given their at least approximate correctness.

First, the method is based on a high quality of the quartz resonators and is directly derived from the constants that characterize the quartz as piezoelectric material and that are thus dependent on the manner in which the quartz is produced but that are defined in order of magnitude. There is thus a fundamental relationship between the geometrical dimensions and the profile data of the quartz as well as the electrical behavior of the quarts resonator within the quartz resonator circuit. The inventive method supplies better and better results the higher the quality of the quartz resonator.

Further, the inventive method only supplies information about the fundamental mode or an arbitrary harmonic of the oscillatory modes. Taking the spurious modes into consideration as well does not ensue with the inventive method. This, however, does not represent a significant disadvantage since this non-consideration of spurious modes is already traditional. The direct conclusion from this finding for the design side is thus the demand made of the developer to see to it, without recourse to the numerical simulation, that the quartz oscillator does not oscillate at an undesired frequency or, for instance, at a plurality of frequencies.

The non-linear behavior given high load, the high resonator currents, that especially occurs given poorly worked crystals is also not taken into consideration by the inventive method. This means that the elements of the electrical equivalent circuit diagram exhibit values dependent on the level control.

Assumptions about the turn-on and transient event.

A set of initial values y(0), which is what terminates the differential equation system F(y,ẏ,t) to a high-value initial value problem, is left out of consideration over and over again in the classic analysis of non-linear systems or, respectively, assumed to be a known influencing variable.

An important question in this context is how a turn-on event that is assumed to be not all too sudden, for instance a behavior of the operating voltage $U_{op}$ modeled by $$U_{op}(t) = U_0 \cdot \left(1 - e^{-\frac{t}{\tau_{op}}}\right) \quad (1)$$

is reflected in the initial electrical behavior of the resonator. The voltage $U_O$ references a final operating voltage and $T_{op}$ references a turn-on time constant. The time is referenced t.

This means that estimates of the values of a second time constant $T_0$ to be introduced and of an initial amplitude $U_{R,O}$ of the external resonator voltage that is modeled according to $$U_R(t) = U_{R,0} \cdot \left(1 - e^{-\frac{t}{\tau_0}}\right) \quad (2)$$

must be made.

A third time constant can be introduced when one considers that the actual operating point of the circuit is only reached after a delay. This is described by an operating point time constant $T_{AP}$.

The inventive method is based on another assumption, namely that the transiency is assumed to be very fast compared to the time constant $T_0$ and to an operating point time constant $T_{AP}$. This means $$\tau_{op} \ll \tau_0^1 \tau_{AP} \quad (3).$$

This condition is met without further ado under normal conditions.

It also becomes clear why manipulations of the operating voltage such as, for instance, an extremely delayed run-up of the operating voltage cannot be taken into consideration in the disclosed method. The considerations necessary for the inventive method are only valid when the turn-on event is assumed as an event having a maximum duration of a few periods of the underlying operating frequency.

The forward transmittance of the series arm of the quartz resonator expressed with a complex frequency s=jω is (see FIG. 2):

$$H(s) = \frac{1}{R + s \cdot L + \frac{1}{s \cdot C}} \quad (4)$$

The index m of the resonator elements is omitted for greater clarity.

When it is further assumed that the quartz resonator represents a no-load for the external voltage increasing according to Equation (2) and the two quantities are thus correlated, then the following expression is obtained for the Laplace transform of the resonator current $I_L$ with a constant $$c = 1/\tau_0 \quad (5)$$

$$L\{I_L\} = U_{R,0} \cdot \frac{c}{s(s+c)} \cdot \frac{1}{R + s \cdot L + \frac{1}{s \cdot C}}$$

$$= \frac{U_{R,0}}{L \cdot \tau_0} \cdot \frac{1}{(s \cdot c)} \cdot \frac{1}{s^2 + s \frac{R}{L} + \frac{1}{L \cdot C}}$$

After a few transformations, one obtains:

$$L\{I_L\} = \frac{U_{R,0}}{L \cdot \tau_0} \cdot \frac{1}{s+c} \cdot \frac{1}{a} \cdot \frac{a}{(s+b)^2 + a^2} \quad (6)$$

$$= \frac{U_{R,0}}{L \cdot \tau_0} \cdot \frac{1}{a} \cdot L\{e^{-(b+c)t}\} \cdot L\{\sin(a \cdot t)\}$$

with $$b^2 = \left(\frac{R}{2L}\right)^2$$

and $$a^2 = \frac{1}{L \cdot C} - b^2$$

Application of the convolution law, as well as, the use of a recursion equation for the occurring integral supplies the following for the resonator current:

$$I_L(t) = U_{R,0}/(L \cdot \tau_0 \cdot a) \cdot \frac{-(b+c)}{(b+c)^2 + a^2} \quad (7)$$

$$\left[-e^{-(b+c)t} \cdot \frac{a}{b+c} - \sin(a \cdot t) + \frac{a}{b+c} \cdot \cos(a \cdot t)\right]$$

After substitution of $$\cos\phi = \frac{b+c}{\sqrt{a^2 + b^2 + c^2 + 2bc}} \quad (8)$$

$$\sin\phi = \frac{a}{\sqrt{a^2 + b^2 + c^2 + 2bc}}$$

the following expression thus derives for the resonator current $I_L(t)$ dependent on the time t:

$$I_L(t) = U_{R,0}(L \cdot \tau_0 \cdot a) \cdot \quad (9)$$

$$\frac{1}{\sqrt{a^2 + b^2 + c^2 + 2bc}} [\sin(a \cdot t - \phi) + \sin\phi \cdot e^{-(b+c)t}]$$

$$= I_{L,0}[\sin(a \cdot t - \phi) + \sin\phi \cdot e^{-(b+c)t}]$$

The amplitude of the resonator current $I_{L,0}$ derives as:

$$I_{L,0} = \frac{U_{R,0}}{L \cdot \tau_0 \cdot a} \cdot \frac{1}{\sqrt{a^2 + b^2 + c^2 + 2bc}} \quad (10)$$

$$= \frac{U_{R,0}}{L \cdot \tau_0} \cdot \frac{1}{\sqrt{\frac{1}{L \cdot C} - \left(\frac{R}{2L}\right)^2}} \cdot$$

$$\frac{1}{\sqrt{\frac{1}{\tau_0^2} + \frac{R}{L \cdot \tau_0} + \frac{1}{L \cdot C}}}$$

An expression thus derives that, for the assumptions that have been made, accurately describes the behavior of the resonator current after the application of the operating voltage.

The index 0 should thereby not be misunderstood as an expression t=0. The designation merely indicates that it is a matter of the initial current that is established after a few periods.

As a result of the assumption $$\frac{1}{L \cdot C} \gg \left(\frac{R}{2L}\right)^2 \quad (11)$$

one obtains the initial amplitude $I_{L,0}$ of the current of the dynamic arm of the quartz resonator, the series arm SA, on the basis of $$I_{L,0} = U_{R,0} \cdot C \cdot \frac{1}{\sqrt{L \cdot C + R \cdot C \cdot \tau_0 + \tau_0^2}} \quad (12)$$

As a result of the further assumption $$R \cdot C \cdot \tau_0 \ll L \cdot C \quad (13)$$

a very simple expression derives for the initial amplitude $I_{L,0}$ of the resonator current:

$$I_{L,0} = U_{R,0} \cdot C \cdot \frac{1}{\sqrt{L \cdot C + \tau_0^2}} = \frac{U_{R,0} \cdot C \cdot \omega}{\sqrt{1 + (\omega \cdot \tau_0)^2}}. \quad (14)$$

In terms of its fundamentals, the determination of the initial amplitude $I_{L,0}$ of the resonator current that has been presented above, is based on document (A. Rusznyak, Start-Up Time of CMOS Oscillators, IEEE Transactions on Circuits and Systems, Vol. 34, No. 3, pp. 259–268, March 1987).

A further assumption with respect to the transient event on which the algorithm is based reads:

$$U_{R,0} = U_{RAP} \quad (15).$$

Following therefrom for the initial amplitude $I_{L,0}$ of the resonator current:

$$\begin{aligned} I_{L,0} &= U_{R,0} \cdot C \cdot \frac{1}{\sqrt{L \cdot C + \tau_0^2}} \\ &= U_{RAP} \cdot \omega \cdot C \cdot \frac{1}{\sqrt{1 + \omega^2 \cdot \tau_0^2}}. \end{aligned} \quad (16)$$

This is equivalent thereto that it is not only the initial current in the resonator but all other network quantities as well that are determined by a calculation of the operating point. The effect of the operating point time constant $\tau_{AP}$ is thus not taken into consideration, this, however, being justified when a further resonator time constant $\tau_r$ to be described later is dominant in value.

Figure 2:
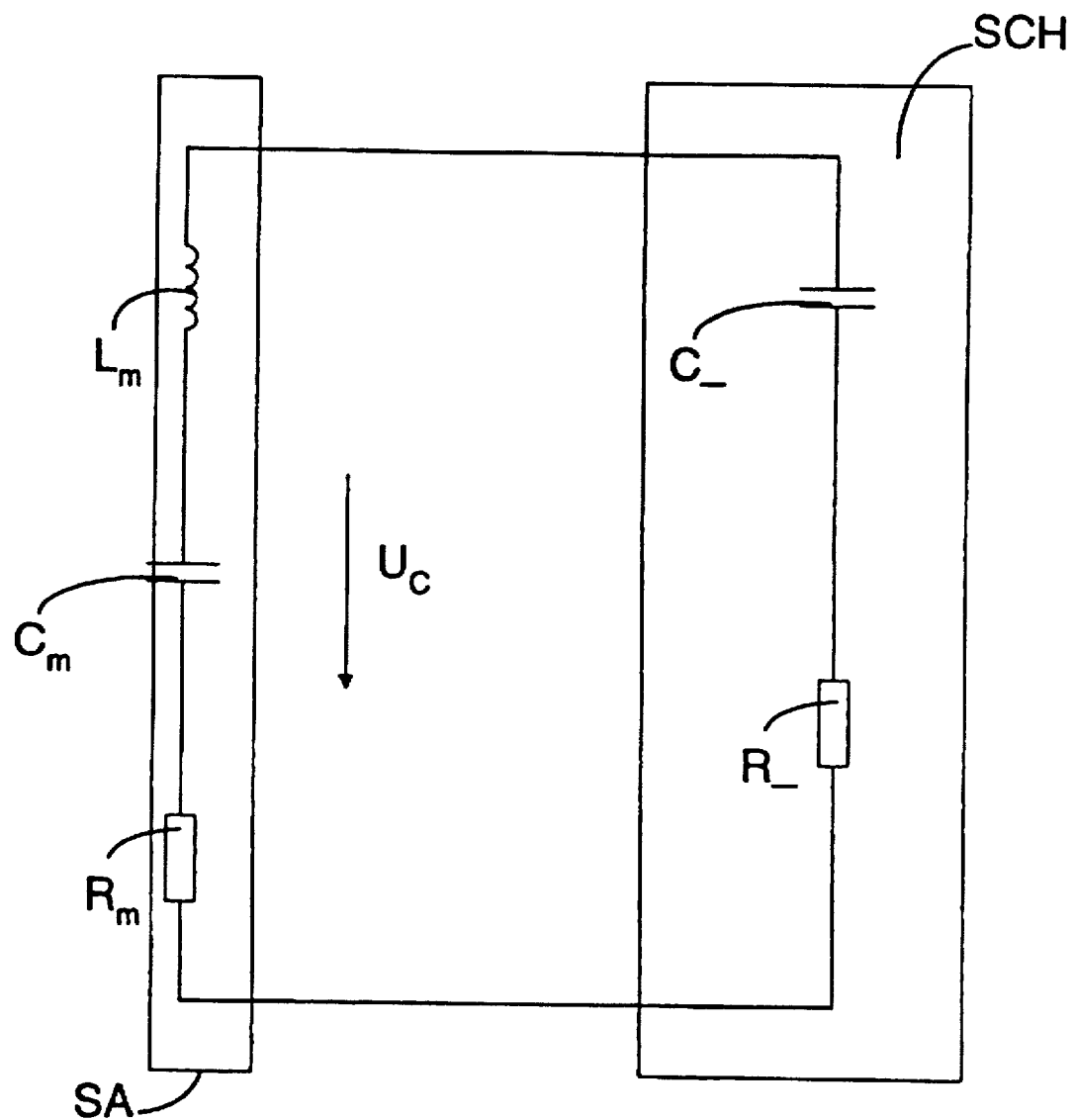
FIG. 2 depicts a circuit wherein a series arm of the equivalent circuit diagram of the quartz resonator is shown, this being coupled to the rest of the circuit and to the parallel arm of the equivalent circuit diagram of the quartz resonator that are modeled in a negative resistance model.

When the negative resistance model shown in FIG. 2 is also assumed, then the equivalent circuit diagram EO of the quartz resonator is capacitatively wired with the load capacitance C and the load resistance R. The circuit SCH plus the parallel arm PA of the equivalent circuit diagram EO is modeled with the load capacitance C and the load resistance R.

After erecting the known differential equations of a resonant circuit of the second order as well as the solution of the characteristic polynomial, $$I_L(t) = I_L(0) e^{\alpha t} \cos(\omega t - \theta) \quad (17).$$

derives as solution for this system according, for example, to approximations made in (N. Nguyen et al., Start-Up and Frequency Stability in High-Frequency Oscillators, IEEE Journal of Solid-State Circuits, Vol. 27, No. 5, pp. 810–820, May 1992).

This solution is composed of an underlying oscillation $\cos(\omega t - \theta)$ that is modeled with an envelope determined by the exponential term $e^{\alpha t}$.

This system only has a solution for resonating when the coefficient α has a positive value, when, thus, the negative resistance R__ has a higher value than the resistance $R_m$ in the definition of the coefficient α with $$\alpha = \frac{|R_-| - R_m}{2 \cdot L_m} \quad (18)$$

and the frequency ω by $$\omega^2 = \frac{1}{L_m \cdot \frac{C_m \cdot C_-}{C_m + C_-}} \quad (19)$$

This thus leads to the following, necessary prerequisite for a solution for resonating of the system:

$$|R_-| > R_m \quad (20).$$

Estimates of the exponential dynamics

A suitable phase angle, θ=90° in this case, is first defined for further discussion but without limiting the universal application.

However, any other definition of the phase angle θ is also possible.

After a few transformations, the following is valid for the time-dependent current through the series arm of the resonator as well as the time-dependent voltage dropping off at the resonator capacitance $C_m$:

$$I_L(t) = -I_L(0) \cdot e^{\alpha t} \cdot \sin(\omega \cdot t) \quad (21)$$

$$U_C(t) = U_C(0) \cdot e^{\alpha t} \cdot \cos(\omega \cdot t).$$

Beginning at a time t=0, the system is thus considered proceeding from the zero-axis crossing of the resonator current $I_L(t)$ by the selection of the phase angle θ, namely from positive to negative values.

After exactly one period, the system will have reached a voltage amplitude of $$U_C(T) = U_C(0) \cdot e^{\alpha T} \quad (22)$$

When it is taken into consideration that the coefficient α is generally not constant, it is precisely this coefficient α that describes the dynamics of the electrical quantities of the resonator over a period of the underlying oscillation that is valid for any arbitrary time t.

For the general case of a differently defined phase, i.e. for θ unequal to 90°, the dynamic of the current would be evaluatable according to $$I_L(t) = I_L(0) \cdot e^{\alpha T} \quad (23)$$

A reciprocal transient time constant $\alpha_0$ in the operating point is defined by $$\alpha(t=0)_{AP} = \alpha_0 = \frac{1}{\tau_R} = \frac{|R_-| - R_m}{2L_m}. \quad (24)$$

It must thereby be stated that the initial condition of the entire network is determined by an operating point calculation.

The term $e^{\alpha T}$ from Equation (22) can be rewritten as:

$$e^{\alpha \cdot T} = \frac{U_C(T)}{U_C(0)} = 1 + \Delta. \quad (25)$$

It turns out that a disturbing term Δ in Equation (25) is always small compared to one. It should thereby be noted, however, that the maximum size of the disturbing term Δ is defined by the material properties of the resonator itself and the maximum value of the disturbing term $\Delta_{max}$ derives from:

$$\Delta_{max} = \frac{\pi}{2r}. \quad (26)$$

A material constant r derives from:

$$r = \frac{\pi^2 \cdot N^2}{8} \cdot \frac{c \cdot \kappa \cdot \epsilon_0}{e^2}. \quad (27)$$

where:
N is the oscillatory mode (N=1: fundamental mode),
c is the coefficient of the elastic rigidity,
k is the effective dielectric constant,
e is the piezoelectric constant,
κ is the piezoelectric coupling coefficient, and
$\epsilon_0$ is the electrical susceptibility.

The material properties of the quartz resonator transformed from the physical domain into the equivalent values of the electrical equivalent circuit diagram and usually leading to excessive calculating times now allow the initially local modelling, i.e. the modelling of the series arm of the quartz resonator valid over at least one period as a sine-shaped current source $I_s(t)$ in the form:

$$I_s(t) = I_S \cdot \sin(\omega \cdot t) \quad (28).$$

The initial amplitude $I_s$ of the series arm as well as the frequency $\omega$ are to be determined with adequate precision. It thus follows that the quartz resonator can be locally modeled in adequate approximation as an independent current source, i.e. at least over one period.

It must be emphasized, however, that this modelling of the series resonant circuit with a sine-shaped current source is valid not only in the steady state but also adequately describes the behavior during transiency. This means that the potential modelling possibilities that have just been described are valid for all points in time during the transience of the quartz resonator circuit, i.e. for all points in times in the time interval $[0, t_r]$.

Dominance of the resonator current

As described above, the resonator current $I_s(t)$ occurring only on the first harmonic can be "emulated" by a source substitution. The most important parameter therefor, the initial amplitude of the current of the dynamic arm of the quartz resonator, can thereby be arbitrarily prescribed at first. The voltage that drops off at the entire quartz resonator would then still remain as unknown quantity after such a substitution. In order to correlate this with the resonator current or, respectively, to be able to derive it therefrom, a further assumption that is critical for the inventive method is made.

This assumption reads:

With respect to the relationship of the resonator time constant to the operating point constant $\tau_{AP}$, the transient event is assumed to be resonator-dominated. Expressed as relationship of the introduced time constants, this means:

$$\tau_{AP} \ll \tau_R = \frac{1}{\alpha_0} = \frac{2 \cdot L_m}{|R| - R_m} \quad (29)$$

Reaching the operating point as well as the shift thereof occurring during the further course of transience are thus to be viewed as being embedded in the transient event defined by the resonator.

It particularly follows therefrom that all relevant shifts of the operating point AP are terminated as long as the circuit operates in linear mode.

By substituting the source, a behavior of the rest of the circuit can thus be compelled that is dependent on the size of the amplitude respectively impressed, i.e., for example, on the initial amplitude of the current of the dynamic arm of the quartz resonator. The assumption of a dominance of the resonator current and the impressing of the current source now provides the possibility of determining the second unknown quantity, the external resonator voltage.

The substitution of the independent current source represents a compulsory condition that "forces" the electrical quantities of the resonator onto the rest of the non-linear network.

When this compulsory condition is combined with the assumption of the resonator-dominated transient event, i.e. the assumption of the dominant resonator time constant $\tau_R$ of the dynamic arm of the resonator (all other dynamic events in the network are characterized by time constants of either about the same size or (in the best case) smaller that can follow the internal transience of the resonator fast enough), a flowchart derives under the influence of the remaining assumptions for the method for determining the transience of a quartz resonator circuit.

Figure 3:
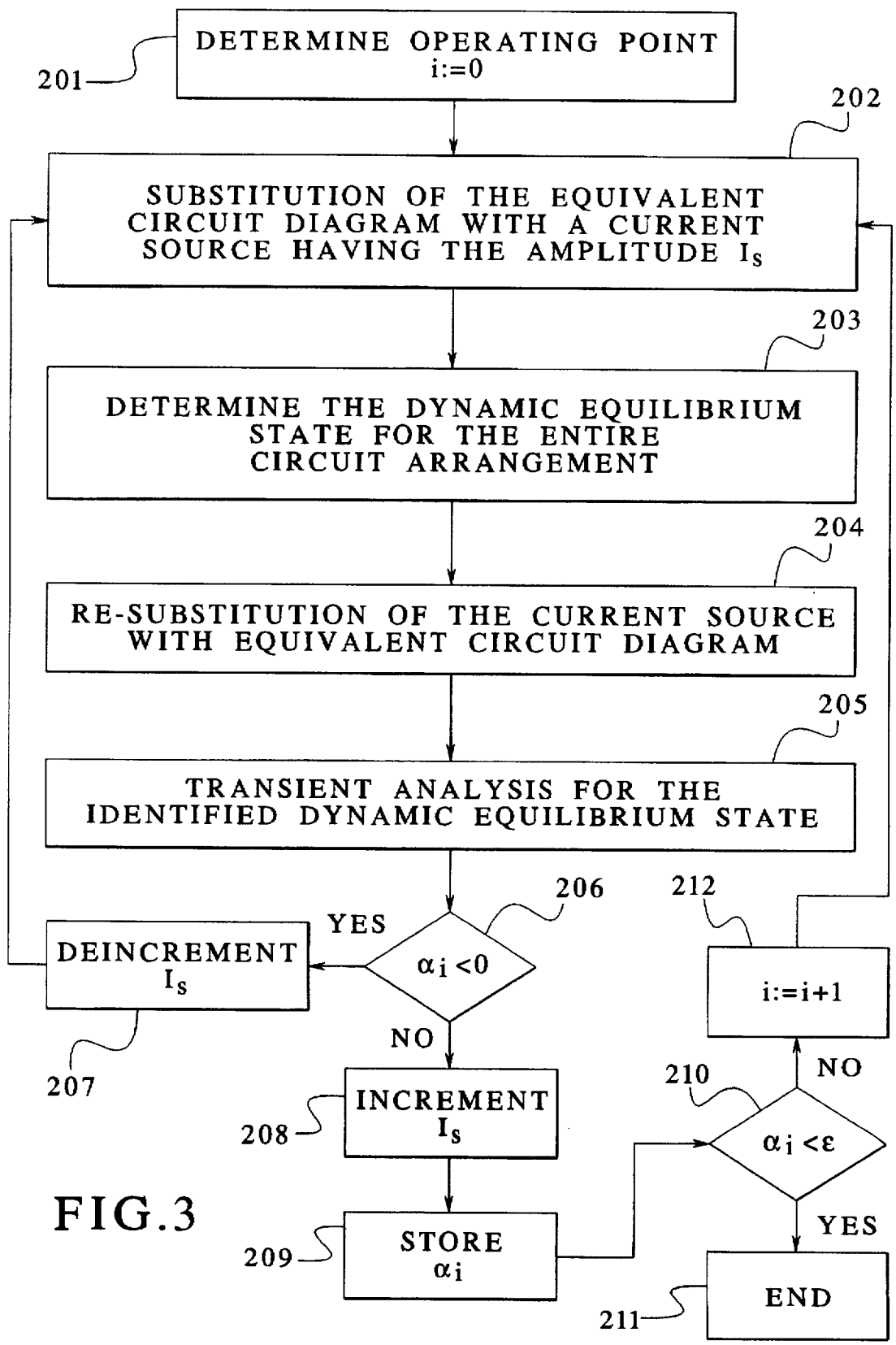
FIG. 3 is a flowchart that describes individual method steps of the inventive method.

This method is shown in a flowchart in FIG. 3. The method is necessarily implemented by a computer.

The operating point AP of the quartz resonator circuit is determined (201) for a first point in time t=0. Further, the initial amplitude of the current in the dynamic arm of the resonator is determined. An initial value zero is assigned to a count index i.

In a further step, an independent current source is now substituted (202) with a given amplitude $I_s$ and a frequency $\omega = \omega_s$. The term $\omega_s$ indicates the resonant frequency of the current supplied by the substituted current source.

A dynamic equilibrium state is now determined (203) for the quartz resonator circuit with the substituted current source. This ensues with known methods, for example with the so-called firing method or with the method of harmonic balance. These methods are described in (K. Kundert et al., Techniques for Finding the Periodic Steady-State Response of Circuits, Analog Methods for Computer-Aided Circuit Analysis and Diagnosis, T. Ozawa (Ed.), Marcel Dekker, Inc., ISBN 0-8247-7843-0, pp. 169–203, 1988).

After the dynamic equilibrium state has been determined, a resubstitution of the equivalent circuit diagram of the quartz resonator ensues (204) for the substituted current source.

A transient analysis is implemented (205) (now in the time domain) for the dynamic equilibrium state for this again "original" circuit arrangement on the basis of what is referred to as transient analysis (U. Feldmann et al., Algorithms for Modern Circuit Simulation AEÜ, Vol. 46, No. 2, Hirzel-Verlag Stuttgart, pp. 274–285, 1992) with modified integration methods that are problem-adapted under certain circumstances. A person skilled in the art is adequately familiar with numerical integration methods that can be utilized in this method.

These, for example, can employ what are referred to as the Euler methods (implicit Euler method, explicit Euler method) as well as what are referred to as the trapezoid integration. A person skilled in the art is adequately familiar with other numerical integration methods (U. Feldmann et al., Algorithms for Modern Circuit Simulation AEÜ, Vol. 46, No. 2, Hirzel-Verlag Stuttgart, pp. 274–285, 1992). These can be utilized without limitation in the inventive method.

Dependent on the value of the count index i, the procedure described below is followed for each iteration step that is implemented by the computer and that is identified by the respective count index i.

At the beginning of the method, i.e. for the count index i=0, a check is made to determine whether the reciprocal transient time constant in the operating point is $\alpha_0 < 0$. When this is the case, the circuit cannot resonate and the procedure is terminated.

A check is carried out for all other iteration steps of the method, i.e. for all values of the count index i>0, whether a growth rate $\alpha_i$ of the amplitude of the current of the dynamic arm of the quartz resonator is determined in respectively the same way as the reciprocal transient time constant at the operating point. An investigation is then made (206) for the growth rate $\alpha_i$ and as to whether this has a positive or a negative value.

When the growth rate $\alpha_i$ in the respective iteration step i has a negative value, then the method for the next iteration step i+1 described below is implemented (207) with a value of the initial amplitude $I_s$ of the current of the substituted source that was reduced.

When, however, the growth rate is $\alpha_i > 0$, then the method in the next iteration loop is implemented (208) with an increased initial amplitude $I_s$ of the current of the dynamic arm of the quartz resonator and, thus, of the substituted source. In this case, the growth rate $\alpha_i$ is stored (209).

Further, when the growth rate is $\alpha_i>0$, the time that elapsed between the two states is determined on the basis of the sum $\alpha_i+\alpha_{i-1}$. When the value of the growth rate $\alpha_i$ lies above the value 0 but below the value of a predetermined barrier $\epsilon$ and the amount of R__ minus is (210) thus the resonator resistance $R_m<\epsilon$. The calculation is terminated (211).

Otherwise, the count index i is incremented (212) by the value 1, the amplitude value $I_s$ of the current source is respectively raised dependent on the growth rate $\alpha_i$, as was set forth above, and the entire method is started anew beginning (202) with the substitution of the independent current source with the amplitude value $I_s$ of the current source that has now been selected.

When the growth rate for an iteration step is $\alpha_i>0$, the value of the growth rate $\alpha_i$ for the respective iteration step is stored (209).

However, when the value of the growth rate is $\alpha_i<0$, this value is not stored.

A determination of the transient period $t_r$ can now approximately ensue from the stored growth rates $\alpha_i$. This preferably derives from the sum of all calculated time steps $\Delta t_i$ for which the proportionality $$(\Delta t)_i = t_i - t_{i-1} \alpha t o \, (\alpha_i + \alpha_{i-1})^{-1} \tag{30}$$

is valid, as shall be described in greater detail below.

The spacing on the time axis between two successive values of $I_L$ or, respectively, $I_s$ referenced with the time steps $(\Delta t)_i$ for the respective iteration step I. When the amount of the negative resistance amount effective at the posts of the quartz resonator approaches the value of the resonator resistance $R_m$, when, thus, $$|R\_|-R_m<\epsilon \tag{31}$$

is valid with the suitably selected barrier $\epsilon$, the transience can be considered ended.

The successive increase of the amplitude $I_s$ of the substituted source at values of the growth rate $\alpha_i$, what is referred to as source stepping, proceeds according to rules familiar to a person skilled in the art.

It is thereby to be emphasized that the limit cycle of the system can be considered reached when the electrical energy consumed within the quartz resonator during a cycle is in turn supplied to it during this cycle, so that the quartz resonator and the circuit are in equilibrium with respect to energy.

An important advantage of this method yet to be specified more precisely below with respect to its individual component parts is that, as was set forth above, the run-up of the substituted source can ensue in large steps compared to the cycle duration of the oscillatory oscillation.

This means that a spacing of (under certain circumstances) several tens of thousands of cycles corresponds to the individual, clearly separated amplitude values $I_s$ of the source on the time axis. The transient characteristic is thus only calculated by points and, provided with a suitable phase condition, following the envelope. The global behavior is reconstructed from these locally extracted quantities and, thus, the transient period is identified.

As described above, an operating point determination (201) is thus implemented at the beginning of the method. This ensues with what is referred to as a DC analysis. As a result of the two capacitances $C_m$ and $C_0$, the quartz resonator is not effective during this analysis in the network.

As was described above, the expression for determining the initial amplitude of the resonator current reads $$I_{L,0} = U_{R,0} \cdot \omega \cdot C_m \cdot \frac{1}{\sqrt{1+\omega^2 \cdot \tau_0^2}} \tag{32}$$

The identified value for the operating point AP is employed for the quantity $U_{R,0}$; the quantity $T_0$ comprises a default value 0.

A manipulation of the expression of equation (32) is possible from the application side by inputting the time constant $\tau_0$. Critical turn-on procedures can be simulated under certain circumstances with this measure when it is not certain whether the current thereby induced is of an adequate size for causing the system to respond.

The substitution by the source converts the originally time-periodic system into a non-autonomous system.

A compelled resonance problem having the form $$x(T) = y(0) \tag{33}$$

is thus to be solved for determining the state vector of the system when frequency and amplitude of the current source are prescribed, whereby T describes the cycle, i.e. derives from $T=2\pi/\omega$.

The firing methods as well as the methods of harmonic balance exist as best known representatives for this function (K. Kundert et al., Techniques for Finding the Periodic Steady-State Response of Circuits, Analog Methods for Computer-Aided Circuit Analysis and Diagnosis, T. Ozawa (Ed.), Marcel Dekker, Inc., ISBN 0-8247-7843-0, pp. 169–203, 1988). The input by such a method and state vector $$x(T) = y(0)$$

determined for a specific source value into the original network becomes a new initial value problem $$F(y, \dot{y}, t_i) = 0$$

with $$t_i \le t \le t_i + p^*T$$

with a known y(0) whose solution over one or more cycles supplies the dynamic behavior valid for $t_i \ldots t_i+p^*T$, $1 \le p \le p_{max}$.

The quantity $p_{max}$ introduced here represents a method parameter that prescribes the maximum plurality of periods to be integrated within the transient analysis. Due to the finitely large abort error of firing methods or methods of harmonic balance, relatively fast compensation events still generally derive, so that a value $p_{max}=2$ was determined as necessary but also as adequate.

The growth rate $\alpha_i$ can be relatively easily determined therefrom according to the following rule:

$$\alpha_i = \frac{1}{T} \ln\left( \frac{U_C(t_i + pT)}{U_C(t_i + (p-1)T)} \right). \tag{34}$$

A transient analysis is thus implemented (205) after the determination of the dynamic equilibrium state by firing methods or by a method of harmonic balance (203) and after resubstitution (204) for the respective dynamic equilibrium state.

Time steps $\Delta t_i$ are now determined from the growth rate $\alpha_i$. It has proven advantageous to determined the time steps $\Delta t_i$ according to the following rule:

$$(\Delta t)_i = (n-1)T = \frac{2}{\alpha_{i-1} + \alpha_i} \cdot \ln\left(\frac{U_c(n \cdot T)}{U_c(T)}\right) \quad (35)$$

The exact meaning of the individual quantities within the method is as follows:

$U_c(T)$ references the voltage dropping off at the resonator capacitance of the series arm.

Corresponding thereto, the growth rate $\alpha_{i-1}$ in the resonator is the value valid for the point in time $t_{i-1}$.

$U_c((n-1)\times T)$ is the starting value for the next transient analysis.

$$U_c((n-1)T) = r_i \cdot U_c(T) \quad (36)$$

represents a value that is initially estimated for the voltage dropping off at the resonator capacitance of the series arm.

$r_i \in \mathfrak{R}$, $r_i > 1$ is a monotonously descending sequence to be suitably formed during the course of the calculation that supplies a rule for running up the current source.

One can objectively speak of a predictor value for the voltage $U_c$ dropping off at the resonator capacitance of the series arm that, however, can only be corrected when $\alpha_i > 0$ is valid for the dynamic derivable therefrom. Otherwise, the predictor value must be discarded.

When $U_c((n-1)T)$ is accepted, then the exact time spacing between the last calculated value, $U_c(T)$, and the current value $U_c(n \times T)$ within the framework of the linearization of $\alpha(t)$ is represented by the following procedure $$\frac{2}{\alpha_{i-1} + \alpha_i} \cdot \ln\left(\frac{U_c(n \cdot T)}{U_c(T)}\right) \equiv \frac{2}{\alpha_{i-1} + \alpha_i} \cdot \ln(r_i) \quad (37)$$

$U_c(n*T)$ is the final value of precisely this analysis when only one cycle is calculated.

It is not necessary to utilize the rule (35) for the formation of the individual time steps $(\Delta t)_i$. Other dependencies, for example expressed by polynomials, are employable within this framework. What is thereby important, however, is considering the indirect proportionality of the incremental time steps $(\Delta t)_i$ to the incremental changes in the growth rate $\alpha_i$, as was presented in Equation (30).

Overall, the transient period $t_f$ derives as follows at the end of the method:

$$t_f = \sum_{i=1}^{n} \frac{2}{\alpha_i + \alpha_{i-1}} \cdot \ln(r_i) = \sum_{i=1}^{n} (\Delta t)_i. \quad (38)$$

This method is necessarily implemented by a computer.

Also, with regards to resonator modeling see L. Dworsky et al., A Simple Single Model for Quartz Crystal Resonator Low Level Drive Sensitivity and Monolithic Filter Intermodulation, IEEE Transactions on Ultrasonics, Ferroelectrics and Frequency Control, Vol. 41, No. 2, pp. 261–268, March 1994.

The invention is not limited to the particular details of the apparatus depicted and other modifications and applications are contemplated. Certain other changes may be made in the above described apparatus without departing from the true spirit and scope of the invention herein involved. It is intended, therefore, that the subject matter in the above depiction shall be interpreted as illustrative and not in a limiting sense.

What is claimed is:

1. A method for computer-assisted iterative determination of the transient response of a quartz resonator circuit in a computer, comprising the steps of:

a) determining an initial amplitude of current in a dynamic arm of the quartz resonator;

b) determining an operating point of the quartz resonator circuit;

c) replacing an equivalent circuit diagram of the quartz resonator with a current source having an initial amplitude of the current in the dynamic arm of the quartz resonator;

d) determining a dynamic equilibrium state for the quartz resonator circuit with the substituted current source;

e) replacing the current source with the equivalent circuit diagram of the quartz resonator;

f) determining with a transient analysis a growth rate of the amplitude of the current in the dynamic arm of the quartz resonator for a dynamic equilibrium state of the quartz resonator circuit;

g) implementing steps b) through f) for an amplitude-boosted current in the dynamic arm of the quartz resonator when the growth rate is greater than zero, and for an amplitude-reduced current in the dynamic arm of the quartz resonator when the growth rate is less than zero, until a current growth rate is less than a predetermined threshold; and h) determining the transience of the quartz resonator circuit from the iteratively determined sequence of growth rates.

2. The method according to claim 1, wherein a firing method is used for determining the dynamic equilibrium state in step f).

3. The method according to claim 1, wherein a method of harmonic balance is used for determining the dynamic equilibrium state in step f).

4. The method according to claim 1, wherein a negative resistance model is used as the equivalent circuit diagram of a circuit to be modeled.

5. The method according to claim 1, wherein a sequence of time steps is determined from a sequence of the growth rate; and wherein the transient period of the quartz resonator circuit derives from a sum of the sequence of time steps.

6. The method according to claim 5, wherein the transient period of the quartz resonator circuit derives from $$f = \sum_{i=1}^{n} \frac{2}{\alpha_i + \alpha_{i-1}} \cdot \ln(r_i) \equiv \sum_{i=1}^{n} \frac{2}{\alpha_i + \alpha_{i-1}} \cdot \ln\left(\frac{U_c(nT)}{U_c(T)}\right) = \sum_{i=1}^{n} \Delta t_i$$

where $r_i$ is a predictor value for a voltage dropping off at the resonator capacitance of the series arm, $U_c(T)$ is a most recently determined value of the voltage dropping off at a resonator capacitance of the series arm, $U_c(nT)$ is a final value of the analysis when only one cycle is determined, $\Delta t_i$ is a time step, and $a_i$ is a growth rate.

7. A method for computer-assisted iterative determination of the transient response of a quartz resonator circuit in a computer, comprising the steps of:

a) using a negative resistance model of the quartz resonator as an equivalent circuit diagram and determining an initial amplitude of current in a dynamic arm of the quartz resonator;

b) determining an operating point of the quartz resonator circuit;

c) replacing the equivalent circuit diagram of the quartz resonator with a current source having an initial amplitude of the current in the dynamic arm of the quartz resonator;

d) determining a dynamic equilibrium state for the quartz resonator circuit with the substituted current source;

e) replacing the current source with the equivalent circuit diagram of the quartz resonator;

f) determining with one of a firing analysis and a harmonic balance analysis a growth rate of the amplitude of the current in the dynamic arm of the quartz resonator for a dynamic equilibrium state of the quartz resonator circuit;

g) implementing steps b) through f) for an amplitude-boosted current in the dynamic arm of the quartz resonator when the growth rate is greater than zero, and for an amplitude-reduced current in the dynamic arm of the quartz resonator when the growth rate is less than zero, until a current growth rate is less than a predetermined threshold; and h) determining the transience of the quartz resonator circuit from the iteratively determined sequence of growth rates.

8. The method according to claim 7, wherein a sequence of time steps is determined from a sequence of the growth rate; and wherein the transient period of the quartz resonator circuit derives from a sum of the sequence of time steps.

9. The method according to claim 8, wherein the transient period of the quartz resonator circuit derives from $$f = \sum_{i=1}^{n} \frac{2}{\alpha_i + \alpha_{i-1}} \cdot \ln(r_i) \cong \sum_{i=1}^{n} \frac{2}{\alpha_i + \alpha_{i-1}} \cdot \ln\left(\frac{U_c(nT)}{U_c(T)}\right) = \sum_{i=1}^{n} \Delta t_i$$

where $r_i$ is a predictor value for a voltage dropping off at the resonator capacitance of the series arm, $U_c(T)$ is a most recently determined value of the voltage dropping off at a resonator capacitance of the series arm, $U_c(nT)$ is a final value of the analysis when only one cycle is determined, $\Delta t_i$ is a time step, and $a_i$ is a growth rate.

10. A method for computer-assisted iterative determination of the transient response of a quartz resonator circuit in a computer, comprising the steps of:

a) determining an initial amplitude of current in a dynamic arm of the quartz resonator;

b) determining an operating point of the quartz resonator circuit;

c) replacing an equivalent circuit diagram of the quartz resonator with a current source having an initial amplitude of the current in the dynamic arm of the quartz resonator;

d) determining a dynamic equilibrium state for the quartz resonator circuit with the substituted current source;

e) replacing the current source with the equivalent circuit diagram of the quartz resonator;

f) determining with a transient analysis a growth rate of the amplitude of the current in the dynamic arm of the quartz resonator for a dynamic equilibrium state of the quartz resonator circuit;

g) implementing steps b) through f) for an amplitude-boosted current in the dynamic arm of the quartz resonator when the growth rate is greater than zero, and for an amplitude-reduced current in the dynamic arm of the quartz resonator when the growth rate is less than zero, until a current growth rate is less than a predetermined threshold;

h) determining a sequence of time steps from a sequence of the growth rate; and l) determining the transient period of the quartz resonator circuit from a sum of the sequence of time steps.

11. The method according to claim 10, wherein a firing method is used for determining the dynamic equilibrium state in step f).

12. The method according to claim 10, wherein a method of harmonic balance is used for determining the dynamic equilibrium state in step f).

13. The method according to claim 10, wherein a negative resistance model is used as the equivalent circuit diagram of a circuit to be modeled.

14. The method according to claim 10, wherein the transient period of the quartz resonator circuit derives from $$f = \sum_{i=1}^{n} \frac{2}{\alpha_i + \alpha_{i-1}} \cdot \ln(r_i) \cong \sum_{i=1}^{n} \frac{2}{\alpha_i + \alpha_{i-1}} \cdot \ln\left(\frac{U_c(nT)}{U_c(T)}\right) = \sum_{i=1}^{n} \Delta t_i$$

where $r_i$ is a predictor value for a voltage dropping off at the resonator capacitance of the series arm, $U_c(T)$ is a most recently determined value of the voltage dropping off at a resonator capacitance of the series arm, $U_c(nT)$ is a final value of the analysis when only one cycle is determined, $\Delta t_i$ is a time step, and $a_i$ is a growth rate.

* * * * *